(12) United States Patent
Hatano et al.

(10) Patent No.: US 10,438,771 B2
(45) Date of Patent: Oct. 8, 2019

(54) MEASUREMENT DEVICE, CALIBRATION METHOD OF MEASUREMENT DEVICE, AND CALIBRATION MEMBER

(71) Applicant: HITACHI HIGH-TECHNOLOGIES CORPORATION, Minato-ku, Tokyo (JP)

(72) Inventors: Michio Hatano, Tokyo (JP); Yoshinori Nakayama, Tokyo (JP); Masaru Matsuzaki, Tokyo (JP); Hiroki Kawada, Tokyo (JP); Yoshinori Momonoi, Tokyo (JP); Zhigang Wang, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 456 days.

(21) Appl. No.: 15/273,523

(22) Filed: Sep. 22, 2016

(65) Prior Publication Data

US 2017/0092462 A1    Mar. 30, 2017

(30) Foreign Application Priority Data

Sep. 28, 2015 (JP) ................. 2015-189120

(51) Int. Cl.
*H01J 37/26* (2006.01)
*H01J 37/28* (2006.01)

(52) U.S. Cl.
CPC ............ *H01J 37/265* (2013.01); *H01J 37/28* (2013.01); *H01J 2237/2826* (2013.01)

(58) Field of Classification Search
CPC ............ G01N 15/0227; G01N 15/147; G01N 23/225; H01J 2237/221; H01J 37/265; H01J 37/28

(Continued)

(56) References Cited

U.S. PATENT DOCUMENTS

2005/0146714 A1*  7/2005  Kitamura ............. G06K 9/00
                                                          356/237.2
2005/0184234 A1   8/2005  Nakayama
                  (Continued)

FOREIGN PATENT DOCUMENTS

JP    2005-241328 A    9/2005
JP    2006-003235 A    1/2006
                  (Continued)

OTHER PUBLICATIONS

Japanese Office Action dated Mar. 26, 2019 for JP Application No. 2015-189120 (with machine translation).

(Continued)

*Primary Examiner* — David P Porta
*Assistant Examiner* — Meenakshi S Sahu
(74) *Attorney, Agent, or Firm* — Miles & Stockbridge, P.C.

(57) ABSTRACT

Provided is a measurement device including: an irradiation optical system which emits a primary charged quantum beam to a sample for scanning; a detector which detects secondary charged particles generated from the sample; and a signal processing unit which processes an output signal from the secondary charged particle detector which has detected the secondary charged particles, in which the signal processing unit includes a measurement unit which measures widths of a first pattern group calibrated with a well-known first dimension and a second pattern group calibrated with a well-known second dimension, and an operation unit which defines a relationship between the well-known dimensions of the first and second pattern groups and length measurement values of the first and second pattern groups as a function. Accordingly, it is possible to control device performance with high accuracy, by controlling a device state so that the measured value (Continued)

described above is within an acceptable range by comparing to a predetermined value provided in advance.

15 Claims, 15 Drawing Sheets

(58) Field of Classification Search
USPC .................................. 250/307, 252.1, 492.3
See application file for complete search history.

(56) References Cited

U.S. PATENT DOCUMENTS

| | | |
|---|---|---|
| 2008/0067370 A1 | 3/2008 | McCaffrey |
| 2008/0203285 A1 | 8/2008 | Sohda et al. |
| 2011/0133065 A1 | 6/2011 | Nakayama et al. |
| 2012/0051518 A1 | 3/2012 | Omote et al. |

FOREIGN PATENT DOCUMENTS

| | | |
|---|---|---|
| JP | 2008-215824 A | 9/2008 |
| JP | 2010-261737 A | 11/2010 |
| JP | 2015-004670 A | 1/2015 |
| WO | 2010/016211 A1 | 2/2010 |

OTHER PUBLICATIONS

JP Office Action dated Nov. 6, 2018 with machine translation for JP Application No. 2015-189120.

\* cited by examiner

FIG. 4
| SEM IMAGE 14 OF FIRST PATTERN GROUP | SEM IMAGE 17 OF SECOND PATTERN GROUP | SEM IMAGE 19 OF THIRD PATTERN GROUP | SEM IMAGE 20 OF FOURTH PATTERN GROUP |
|---|---|---|---|
| 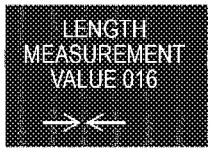 | 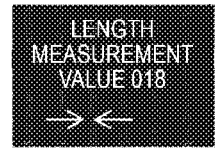 | 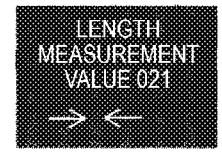 | 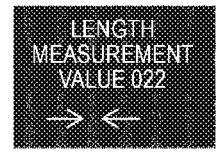 |

FIG. 18
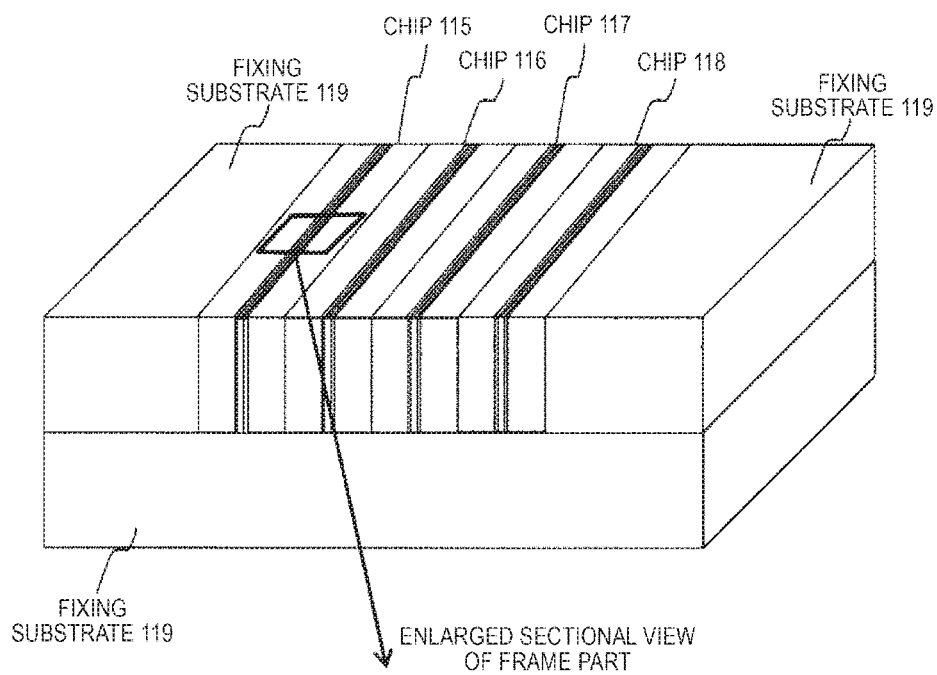
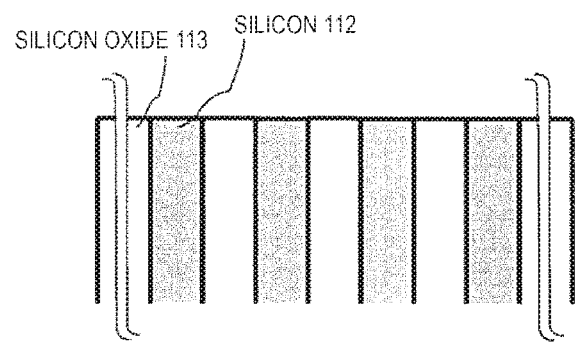

MEASUREMENT DEVICE, CALIBRATION METHOD OF MEASUREMENT DEVICE, AND CALIBRATION MEMBER

CLAIM OF PRIORITY

The present application claims priority from Japanese patent application JP 2015-189120 filed on Sep. 28, 2014, the content of which is hereby incorporated by reference into this application.

BACKGROUND OF THE INVENTION

Field of the Invention

The specification relates to a measurement device which emits charged particle beams to a sample and detects signal electrons generated from the sample to obtain information regarding the sample, a calibration method of the measurement device, and a calibration member.

Background Art

There is a charged particle beam device which scans an observation visual field area of a sample surface of a semiconductor device which is an observation target with an electronic probe, detects signal electrons generated from the sample to obtain a two-dimensional image, and performs length measurement of a dimension of a structure of the sample which is a target by using the two-dimensional image.

Among these, a critical dimension-SEM (CD-SEM) using a technology of a scanning electron microscope (SEM) is used. A charged particle beam device which automatically inspects and classifies defects of a sample from a two-dimensional image acquired in the same manner as described above includes an inspection SEM. The CD-SEM and the inspection SEM are tools necessary for controlling a yield rate in a semiconductor manufacturing step.

Meanwhile, a dimension of a length measurement and inspection target becomes closer to a probe diameter of the CD-SEM or the inspection SEM, along recent advancements in refinement.

SUMMARY OF THE INVENTION

As described above, the fine pattern in the length measurement and the inspection in recent years becomes closer to the probe diameter. Accordingly, it was determined that fluctuation or a difference between devices regarding the fine probe diameter which was not actualized in the related art may affect the length measurement results or inspection results.

With the background described above, in order to examine a state of a device to control resolving power, it is necessary to provide a unit which measures a probe diameter of a primary electron beam with an absolute dimension having traceability, and controls device performance, particularly, resolving power, so that the probe diameter becomes a predetermined value, to control the device performance with high accuracy. The traceability herein indicates that the tracing can be performed to a reference length which is normally defined.

In order to perform probe diameter measurement having traceability, it is necessary to measure an actual dimension of a calibration member having an uneven pattern having guaranteed dimensions by using a measurement method having traceability. The actual dimension herein indicates a dimension (for example, line width or space width) for calibrating resolving power.

In a calibration member of the related art, it was necessary to measure actual dimensions by using a scanning probe microscope, in order to measure an actual dimension such as a line width of an uneven pattern.

However, in the refinement, the probe diameter of the scanning probe microscope was too large, in order to measure a pattern having a dimension equivalent to the probe diameter, and accordingly, measurement with high accuracy was difficult to be performed. In addition, JP-A-2005-241328 discloses the invention of a standard member for calibration of a pitch width by using laser light, but JP-A-2005-241328 only discloses a technology of comparing a length measurement pitch width and a reference pitch width one on one, and only discloses a technology of displaying abnormality of calibration, in a case where a comparison value is equal to or greater than a constant value.

That is, the inventors first considered the necessity to acquire fluctuation or a difference between devices regarding a fine probe diameter, and therefore, found that a measurement width and a reference width are respectively acquired at multiple points and are functionalized and the profile of a charged particle beam which becomes a probe can be assumed based on the results thereof.

The present invention has been made to address the aforementioned problems and an object of the invention is to measure a probe diameter and a probe profile of a measurement device with an absolute dimension having traceability to control the device performance (particularly, resolving power).

In order to solve aforementioned problems, according to an aspect of the present invention, there is provided a measurement device including: an irradiation optical system which emits a primary charged quantum beam to a sample for scanning; a detector which detects secondary charged particles generated from the sample; and a signal processing unit which processes an output signal from the secondary charged particle detector which has detected the secondary charged particles, and in which the signal processing unit includes a measurement unit which measures a line width of a first pattern group having a first line width calibrated with a well-known dimension, and a line width of a second pattern group having a second line width calibrated with a well-known dimension, and an operation unit which defines a relationship between the first and second line widths of the first and second pattern groups and length measurement values of the first and second pattern groups as a function.

In order to solve aforementioned problems, according to another aspect of the invention, there is provided a calibration method of a measurement device including an irradiation optical system which emits a primary charged quantum beam to a sample for scanning, a detector which detects secondary charged particles generated from the sample, and a signal processing unit which processes an output signal from the secondary charged particle detector which has detected the secondary charged particles, the method including: measuring a line width of a first pattern group having a first line width calibrated with a well-known dimension and a line width of a second pattern group having a second line width calibrated with a well-known dimension; and defining a relationship between the first and second line widths of the first and second pattern groups and length measurement values of the first and second pattern groups as a function.

In order to solve aforementioned problems, according to still another aspect of the invention, there is provided a calibration member for a charged particle beam device for performing calibration by using an X ray, including: a first pattern group formed to have a well-known first line width;

BRIEF DESCRIPTION OF THE DRAWINGS

FIG. 4 is a diagram showing a SEM image and a length measurement value of each pattern group.

FIG. 18 is a schematic view of a polishing process of the standard members according to the embodiment of the invention.

DETAILED DESCRIPTION OF THE INVENTION

According to a representative embodiment of the invention, it is possible to measure a probe diameter or a probe profile of a charged particle beam device such as an electron microscope with an absolute value having traceability. It is possible to control device performance with high accuracy by controlling a device so that the measured value described above is within an acceptable range by comparing to a reference value.

In each embodiment, a CD-SEM mainly using a SEM as a charged particle beam device will be described as an example, but there is no limitation, and an inspection SEM or a general-purpose SEM may be used. Even by using an inspection SEM or a general-purpose SEM, it is possible to control device performance with high accuracy by applying a probe diameter measurement method by using a standard member for calibration disclosed in the invention.

First Embodiment

Figure 1:
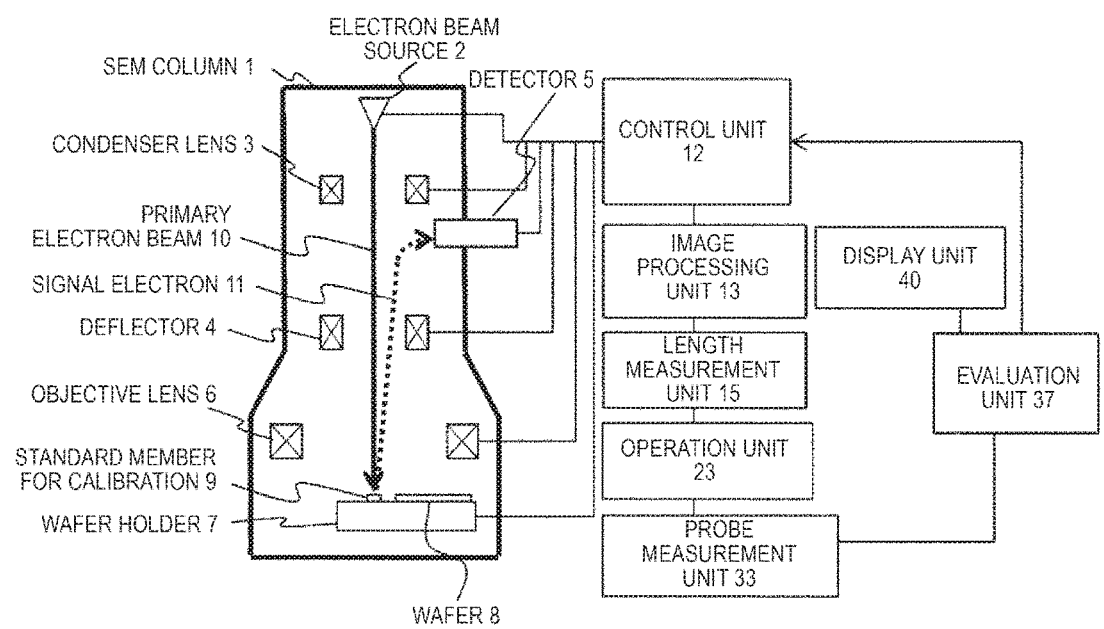
FIG. 1 is a diagram showing device appearance of a measurement device of the invention.

FIG. 1 is a schematic view of a measurement device of the embodiment. Here, the CD-SEM will be described as an example of the measurement device. First, the CD-SEM includes a SEM column 1 the inner portion of which is maintained in a vacuum state, and an electron beam source 2, a condenser lens 3, a deflector 4 which deflects an electron beam, a detector 5 which detects electrons, an objective lens 6 which focuses an electron beam to a sample, and a wafer holder 7 on which a sample is installed are included in the column 1.

A wafer 8 on which a pattern is formed and which is a measurement target and a standard member for calibration 9 are fixed to the upper portion of the wafer holder 7. The standard member for calibration 9 is mounted on a standard member for calibration holder (not shown) and is detachable from the wafer holder 7. The standard member for calibration 9 may be directly fixed to the upper portion of the wafer holder 7.

Figure 2:
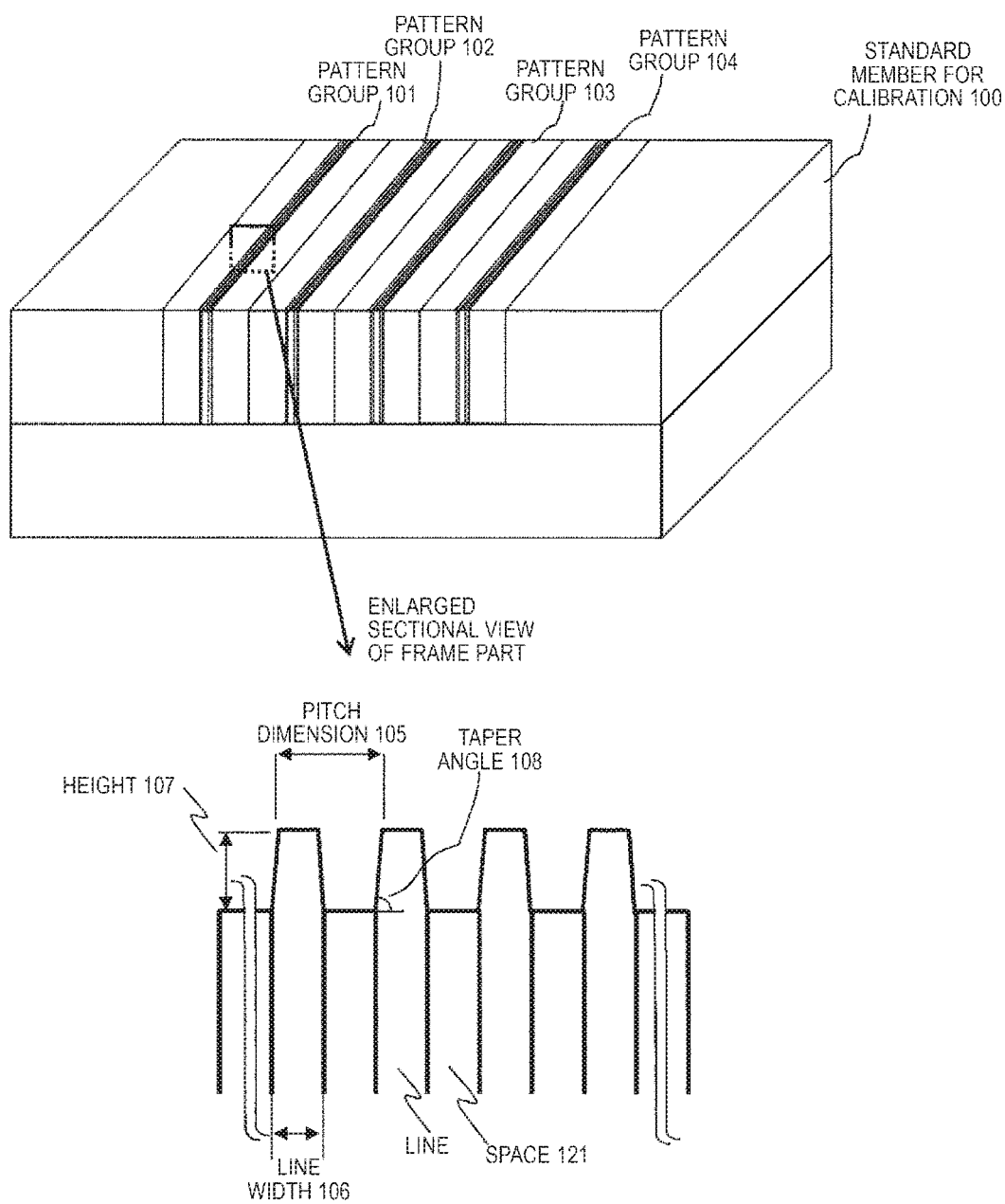
FIG. 2 is a schematic view of a standard member of the invention.

First to fourth pattern groups 101 to 104 having a fixed pitch dimension (p) and different actual dimensions (l) of line widths of the pattern groups are formed on the standard member for calibration 9, as shown in FIG. 2. The actual dimensions of line widths of the first to fourth pattern groups are calibrated by using a method having traceability. The method having traceability will be described in the later part of this specification.

A primary electron beam 10 generated from the electron beam source 2 is focused on a surface of a sample which is an observation target by the condenser lens 3 and the objective lens 6. The deflector 4 scans the primary electron beam 10 in a visual field area designated on the sample surface. A signal electron 11 derived from the sample is generated by the emission of the primary electron beam 10. The detector 5 detects the signal electron 11 and converts the signal electron into an electrical signal. The electron beam source 2, the condenser lens 3, the deflector 4, the detector 5, the objective lens 6, and the wafer holder 7 are controlled by a control unit 12.

FIG. 2 is a flowchart showing a flow of measuring a probe diameter of the CD-SEM of the invention and adjusting the device so that the measured probe diameter becomes a predetermined value. That is, when the probe diameter measurement is commanded, the control unit 12 moves the wafer holder 7 to dispose the first pattern group on the standard member for calibration 9 in a convergence position of the primary electron beam 10 (Flow 041).

The control unit 12 controls the deflector 4 to scan the upper portion of the first pattern group on the standard member for calibration 9 with the primary electron beam 2 multiple times in a predetermined visual field. The control unit 12 transfers the electrical signal of the detector 5 synchronized with the scanning with the primary electron beam 2 to an image processing unit 13. In the image processing unit 13, a SEM image 14 of the first pattern group is generated from the electrical signal (Flow 042) and the SEM image is transferred to a length measurement unit 15. In the length measurement unit 15, a line width is measured from the SEM image of the first pattern group (Flow 043) and a length measurement value 16 of the first pattern group is stored.

Next, the control unit 12 disposes the second pattern group on the standard member for calibration 9 in a convergence position of the primary electron beam 10 (Flow 044). In the same process as that of the first pattern group, a SEM image 17 of the second pattern group is generated on the second pattern group on the standard member for calibration 9 (Flow 045) and the SEM image is transferred to the length measurement unit 15. In the length measurement unit 15, a line width of the second pattern group is measured in the same process as that of the first pattern group (Flow 046) and a length measurement value 18 of the second pattern group is stored.

In addition, a SEM image 19 of the third pattern group and a SEM image 20 of the fourth pattern group are generated in the control unit 12 in the same process as that of the first and second pattern groups, and in the length measurement unit 15, a line width of the third pattern group and a line width of the fourth pattern group are measured in the same process as that of the first and second pattern groups (Flow 047), and a length measurement value 21 of the third pattern group and a length measurement value 22 of the fourth pattern group are stored.

Figure 5:
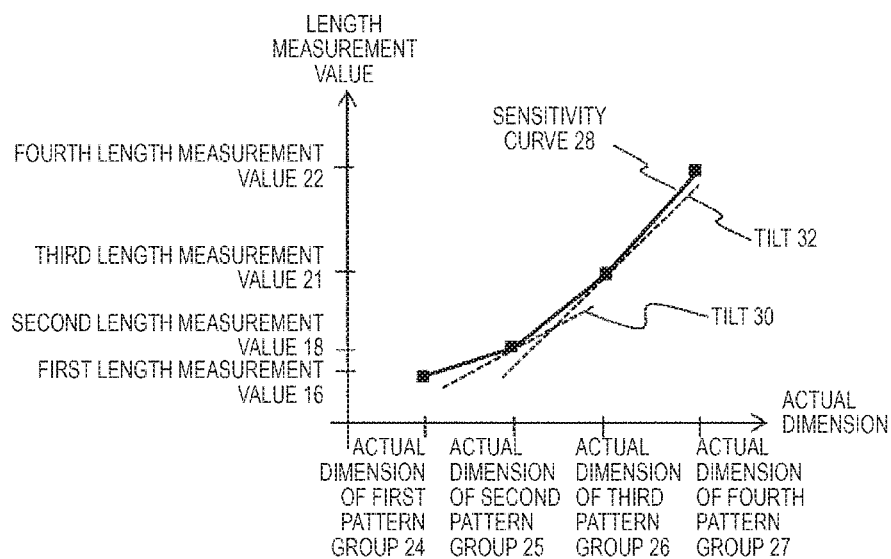
FIG. 5 is a diagram showing actual dimensions and length measurement values as a sensitivity curve.

Then, the length measurement unit 15 transfers length measurement values of the first to fourth pattern groups to an operation unit 23. In the operation unit 23, a actual dimension 24 of a line width of the first pattern group, an actual dimension 25 of a line width of the second pattern group, an actual dimension 26 of a line width of the third pattern group, and an actual dimension 27 of a line width of the fourth pattern group are stored in advance, and a sensitivity curve 28 having plotting of first to fourth length measurement values with respect to these actual dimensions is created and stored. The sensitivity curve acquired herein is shown in FIG. 5.

In the operation unit 23, a length measurement sensitivity 29 of the second pattern group is calculated from the actual dimensions and the length measurement values of the first to third pattern groups and stored (Flow 048). Here, the length measurement sensitivity 29 of the second pattern group corresponds to a tilt 30 of the actual dimension value of the line width of the second pattern group on the sensitivity curve 28 acquired by approximating a multi-degree function from the actual dimensions and the length measurement values of the first to third pattern groups.

In the operation unit 23, a length measurement sensitivity 31 of the third pattern group is calculated from the actual dimensions and the length measurement values of the second to fourth pattern groups and stored (Flow 048). The length measurement sensitivity 31 of the third pattern group corresponds to a tilt 32 of the actual dimension value of the line width of the third pattern group on the sensitivity curve 28.

Figure 6:
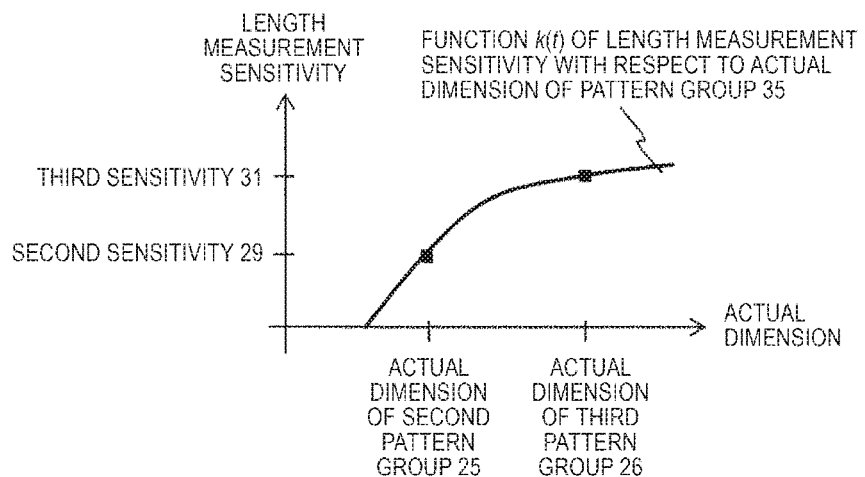
FIG. 6 is a diagram showing actual dimensions and length measurement sensitivity as a function.

Next, the operation unit 23 transfers the second and third length measurement sensitivity to a probe measurement unit 33. In the probe measurement unit 33, a graph having plotting the second and third length measurement sensitivity with respect to the actual dimensions of the line widths of the second and third pattern groups is created. The graph acquired herein is shown in FIG. 6.

The probe measurement unit 33 stores a function k(t) 35 which is a length measurement sensitivity with respect to an actual dimension t of a line with of a pattern group using the probe diameter as a variable 34, in advance. In the probe measurement unit 33, the fitting of k(t) 35 is performed with respect to data points of the second and third length measurement sensitivity plotted with respect to the actual dimensions of the line widths of the second and third pattern groups while changing the variable 34. As a result, the variable 34 which causes the smallest sum of squares of residuals of k(t) and the length measurement sensitivity is determined and this is set as a probe diameter 36 (Flow 049).

Next, the probe measurement unit 33 transfers the obtained probe diameter 36 to a probe diameter evaluation unit 37. In the probe diameter evaluation unit 37, the obtained probe diameter 36 is compared to a reference probe diameter 38 provided in advance, and it is determined whether or not an absolute value of a difference of both probe diameters is within an acceptable range 39 provided in advance (Flow 050).

At this time, in a case where the absolute value is in the acceptable range, the process ends. At this time, the obtained probe diameter 36 and adjustment completion display may be output to a display unit 40 (Flow 051).

Meanwhile, in a case where the absolute value is not in the acceptable range, the obtained probe diameter 36 and adjustment continuation display are output (Flow 052) to the display unit. In addition, it is preferable that the control unit 12 starts adjustment of an optical system (Flow 053) and commands the probe diameter measurement again after the adjustment.

The constituent elements other than the control unit 12 described above can perform the processes or operations by using other devices which process data output from the measurement device and may not be compulsorily in a relationship of the block diagram shown in the drawing.

First Embodiment, Details of Probe Measurement Unit

Hereinafter, in the first embodiment, the function 35 of the length measurement sensitivity with respect to the actual dimension of the line width of the pattern group using the probe diameter measurement unit 33 will be described in detail.

Here, the length measurement sensitivity when the actual dimension of the line width of the pattern group is l is shown as k(l) using a function of l. The probe diameter is shown as r. According to the investigation of the inventors, it is found that, in a case where a pitch p, l, and r are close numerical values, the length measurement sensitivity k(l) is shown with the following Equation (1) using g(r,l) and h(l) which are two functions of r and l.

Here, g(r,l) is a distribution function of the primary electron beam and h(l) is a function dependent on a sectional shape or a composition structure of the standard member for calibration 9.

$$k(l)=1-C\cdot\{g(r,\tfrac{1}{2})\cdot h(l)+g(r,p/2-\tfrac{1}{2})\cdot h(1)\} \quad\text{Equation (1)}$$

Here, a value C is a variable dependent on the pitch p of the calibration member, but since p of the standard member for calibration 9 is fixed, it is used as a constant. With Equation (1), the function 35 of the length measurement sensitivity with respect to the actual dimension of the line width of the pattern group is obtained.

In the most simplified format, g(r,l) is Gaussian function having an average of 0 and a half-value width (FWHM) of r, and h(l) is a constant of 1. However, Equation (1), the function g(r,l) or h(l) are not limited thereto, and the optical conditions of the primary electron beam, or functions acquired by a simulation or an experiment for each standard member for calibration 9 may be used.

Second Embodiment

Figure 7:
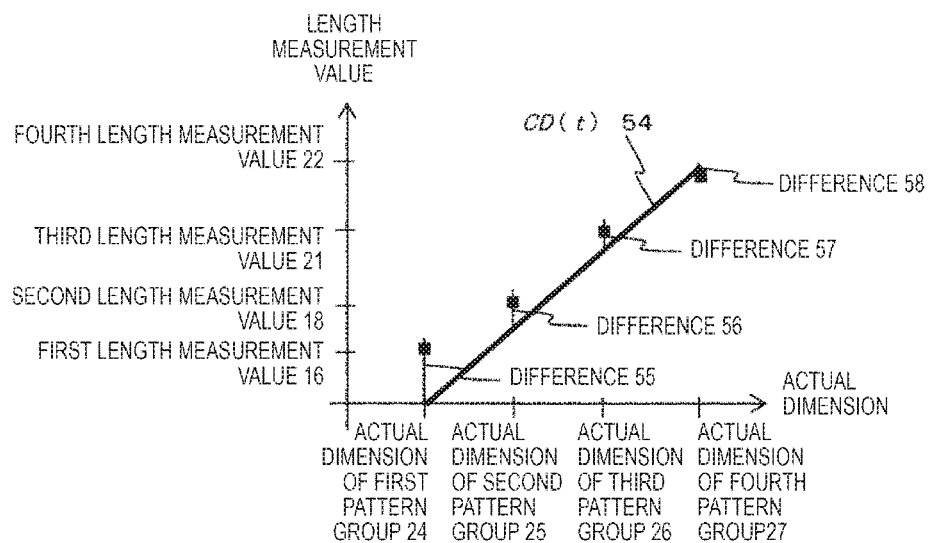
FIG. 7 is a diagram showing differences between a sensitivity curve and previously stored values.
Figure 8:
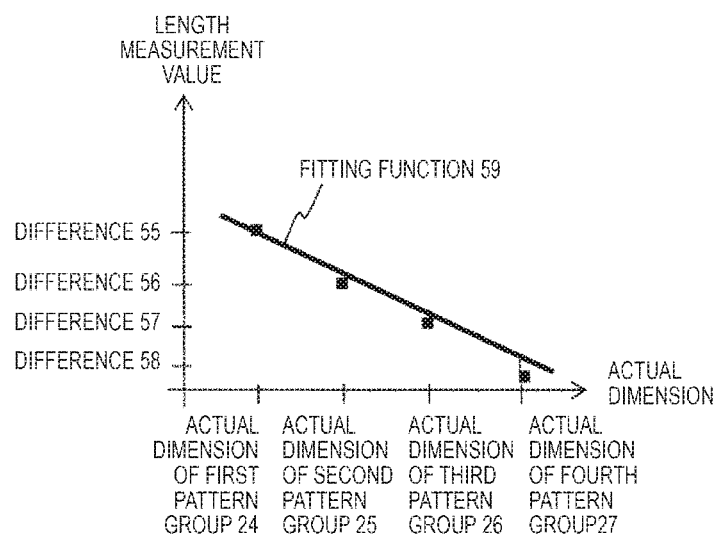
FIG. 8 is a diagram in which the actual dimensions of the pattern groups and the differences are plotted.
Figure 9:
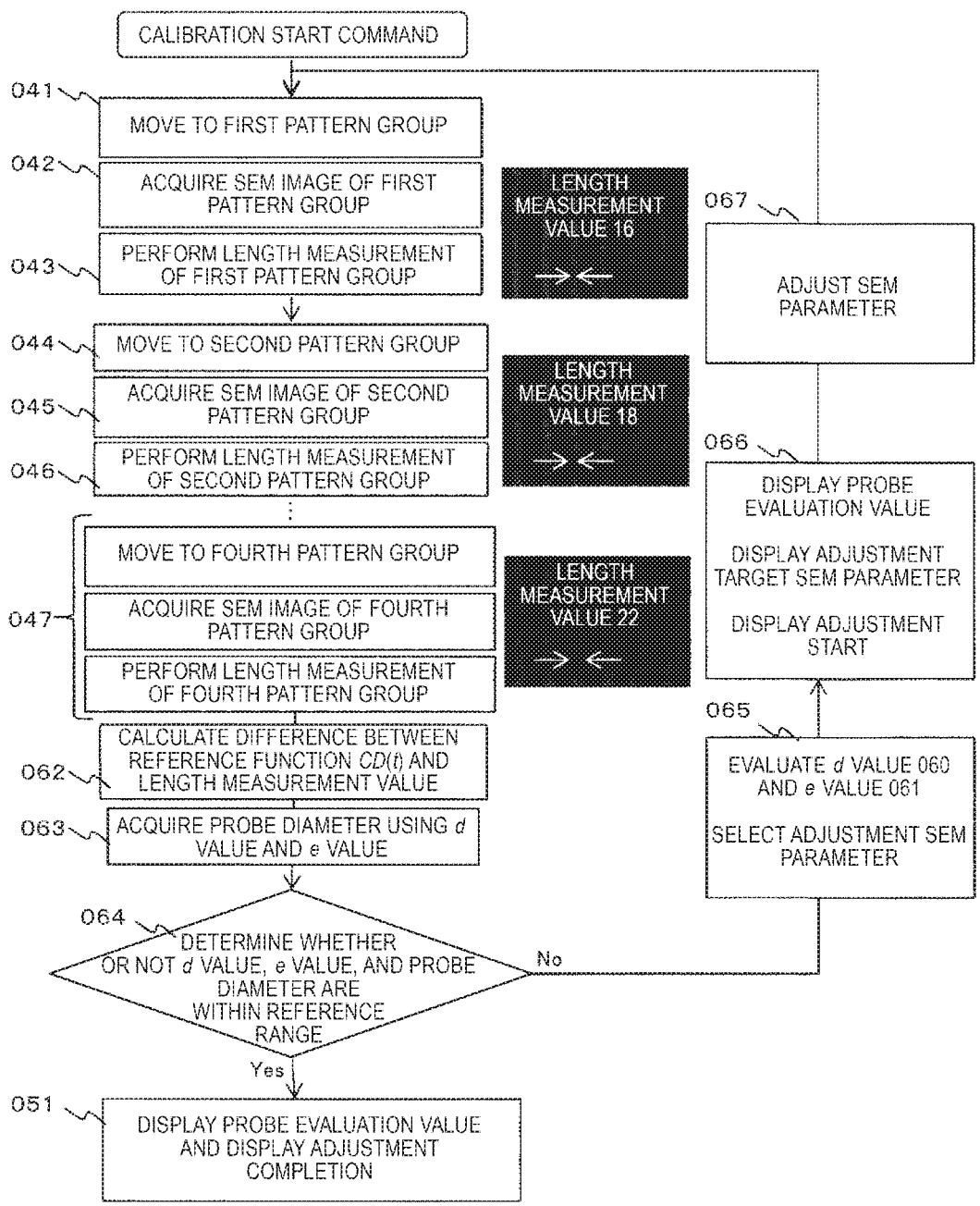
FIG. 9 is a diagram of a flowchart of a second embodiment.

Next, FIG. 9 is a flowchart of a second embodiment. In the second embodiment of the invention, the processes subsequent to the process performed by the operation unit 23 are different from the first embodiment. In the second embodiment, as shown in FIG. 7, in the operation unit 23, CD(t) 54 which is a function of a measurement length value with respect to an actual dimension as a reference is provided, in advance.

In the operation unit 23, in the first to fourth pattern groups, a difference 55 (first length measurement value 16-CD (actual dimension of line width of first pattern group), a difference 56 (first length measurement value 18-CD (actual dimension of line width of second pattern group), a difference 57 (first length measurement value 21-CD (actual dimension of line width of third pattern group), and a difference 58 (first length measurement value 22-CD (actual dimension of line width of fourth pattern group) are calculated and stored (Flow 62).

Next, the operation unit 23 transfers the difference 55, the difference 56, the difference 57, and the difference 58 to the flow measurement unit 33. In the probe measurement unit 33, a graph obtained by plotting the differences with respect to the actual dimensions of the line widths of the pattern groups is created. The graph acquired herein is shown in FIG. 7.

Next, in the probe measurement unit 33, the fitting of the obtained data points is performed by the least squares method while varying a parameter of multi function j(t) provided in advance, and a fitting function 59 is obtained. In the second embodiment, the multiple function is a linear function shown as j=d·t+e.

According to the previous examination of the inventors, it is found that a tilt d value 60 and apiece e value 61 which are parameters obtained by the fitting are dependent on the probe diameter or other SEM parameters. In the probe diameter measurement unit 33, the values of the tilt d value 60 and the piece e value 61 obtained in the fitting are compared to a data table (not shown) provided in advance, and the probe diameter 36 is acquired (Flow 63).

Next, the probe measurement unit 33 transfers the obtained probe diameter 36, the d value 60, and the e value 61 to the probe diameter evaluation unit 37. In the probe diameter evaluation unit 37, the obtained probe diameter 36 is compared to the reference probe diameter 38 provided in advance, and it is determined whether or not an absolute value of a difference of both probe diameters is within the acceptable range 39 provided in advance. The d value 60 and the e value 61 are evaluated and it is determined whether or not both values are within the acceptable range provided in advance (Flow 064).

In a case where any one is not within the acceptable range, the d value 60 and the e value 61 are evaluated and a suitable adjustment SEM parameter is selected (Flow 065). Next, the obtained probe diameter 36, the adjustment target SEM parameter, the adjustment continuation display are output to the display unit (Flow 066), the selected adjustment SEM parameter is adjusted (Flow 067), and the probe diameter measurement is commanded again, after the adjustment.

In a case where all of the reference probe diameter 38, the d value 60, and the e value 61 are in the acceptable range, the process ends, and the obtained probe diameter 36 and the adjustment completion display are output to the display unit 40 (Flow 051).

In a case where the tilt d value 60 and the piece e value 61 are not in the acceptable range, an example of selecting a suitable adjustment SEM parameter is as follows. In a case where the d value 60 is in the acceptable range and the e value 61 is smaller than the acceptable range, the brightness setting of an image is a domain adjustment target. Meanwhile, in a case where the d value 60 is in the acceptable range and the e value 61 is smaller than the acceptable range, the contrast setting of an image is a main adjustment target.

In the second embodiment, the multi function j(t) is set as a linear function, but may be a higher-order function. In this case, the number of parameters obtained by the fitting increases, and it is possible to perform the probe diameter measurement having higher accuracy and to specify the adjustment SEM parameter having higher accuracy.

Third Embodiment, Combination of First and Second Embodiments

The third embodiment of the invention performs both processes performed by the operation unit 23 and the probe diameter measurement unit 33 shown in the first embodiment and the second embodiment. As the probe diameter 36, a value obtained by using the method described in the first embodiment is preferentially used. The subsequent processes are the same as those in the second embodiment.

Determining Method of Reference Value and Reference Function

In the first, second, third embodiments, the reference probe diameter 38, the CD(t) 54 which is a function of a length measurement value with respect to an actual dimension as a reference, and the acceptable ranges thereof are used, but the references and the acceptable range may be acquired by a simulation or the like. In this case, the references are ideal values acquired in principle and generality is improved. Meanwhile, since the simulation may not reproduce physical phenomena, the references such as reference probe diameter 38 or the CD(t) 54 which is a function of a length measurement value with respect to an actual dimension as a reference are set as an average of results measured by a plurality of CD-SEMs, and the acceptable range thereof may be set to be three times the standard deviation of the results measured by the plurality of CD-SEMs.

In the first, second, and third embodiments, the first to fourth pattern groups having a fixed pitch dimension (p) and different actual dimensions (l) of line widths of the pattern groups are formed as the pattern groups on the standard member for calibration 9, but the number of pattern groups may be any number, as long as it is a suitable number. When the number of pattern groups is large, that is, in a case where five or more groups are used, in the first embodiment, the number of the data points where length measurement sensitivity can be evaluated increases, it is possible to increase the fitting accuracy of the function k(t) of the length measurement sensitivity with respect to the pattern group dimension, and it is possible to obtain the probe diameter with higher accuracy. In the second embodiment, the number of the data points increases, and accordingly, it is possible to specify the SEM adjustment parameters having higher accuracy. As the number of pattern groups is small, that is, in a case where two or three groups are used, the number of data points decreases, and accordingly, the probe diameter measurement accuracy decreases, but the number of times of the SEM observation is decreased, and accordingly it is advantageous that the adjustment cycle is rapidly set.

Arrangement of Standard Member for Calibration 9 on Wafer

Figure 10:
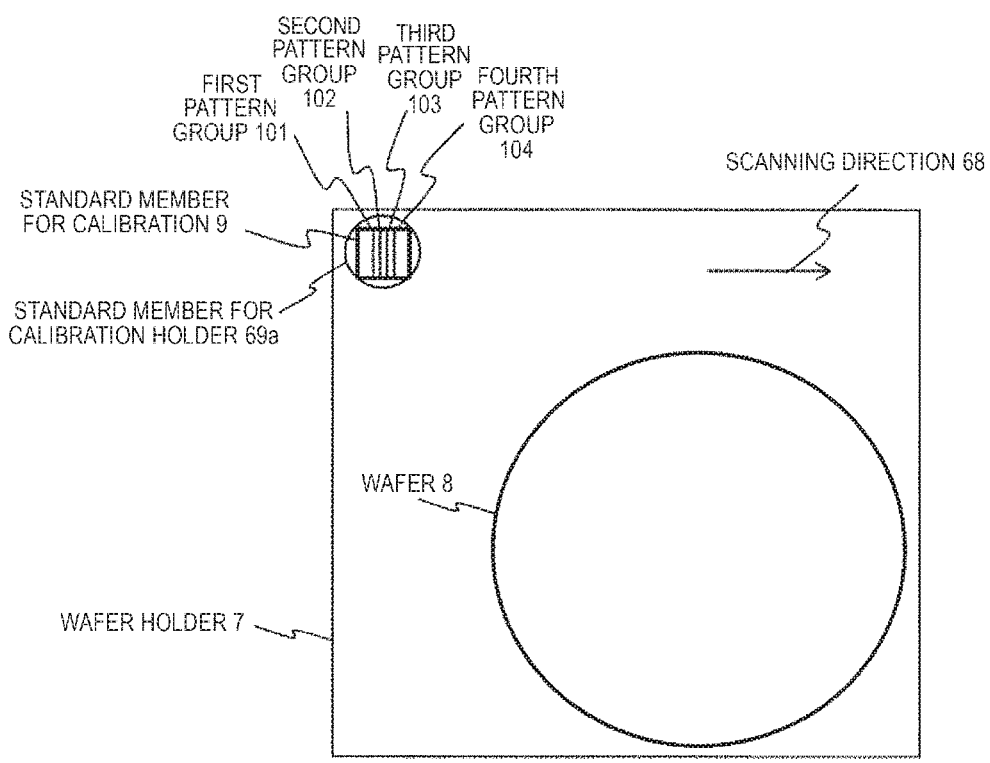
FIG. 10 is a top view of a sample and a calibration member of first to third embodiments.

FIG. 10 is a top view of the wafer holder 8 of the CD-SEM shown in the first to third embodiments. The standard member for calibration 9 is fixed to a standard member for calibration holder 69a and the standard member for calibration holder 69a is fixed to the wafer holder 7. At this time, the standard member for calibration 9 is disposed so that a line direction of the pattern group is orthogonal to a scanning direction 68 of the primary electron beam. According to such calibration, it is possible to measure a probe diameter in the scanning direction of the primary electron beam.

Fourth Embodiment

Figure 11:
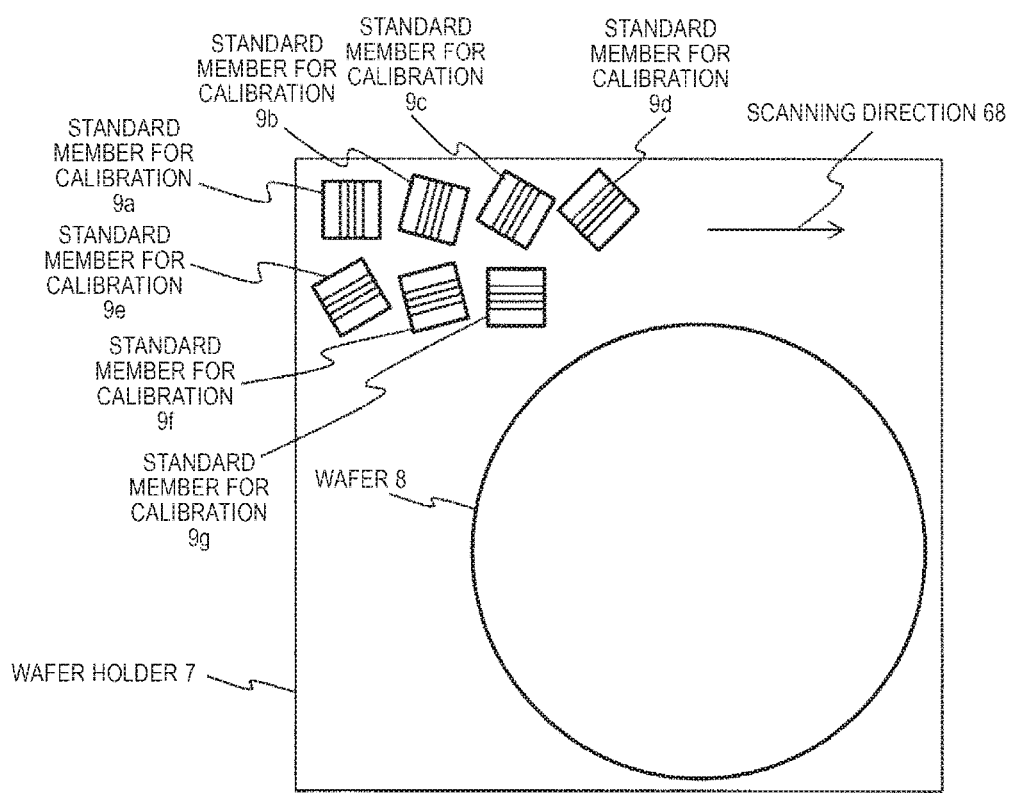
FIG. 11 is a top view of a sample and a calibration member of a fourth embodiment.

FIG. 11 is a top view of a wafer holder of a fourth embodiment. In the fourth embodiment of the invention, the plurality of standard members for calibration 9 used in the first to third embodiments are provided. As the standard members for calibration 9, seven standard members for calibration 9a to 9g are disposed and are respectively rotated by 0°, 15°, 30°, 45°, 60°, 75°, and 90° with respect to the scanning direction 68 of the primary electron beam. By using any of the method described in the first to third embodiments with respect to each standard member for calibration 9, it is possible to acquire a two-dimensional profile of a sample surface height of the primary electron beam.

In the fourth embodiment, a rotation angle is changed by a step of 15°, but the invention is not limited thereto. When the angle step is further decreased and more standard members for calibration are used, it is possible to obtain a two-dimension profile of the primary electron beam having higher accuracy. Meanwhile, when the angle step is increased and less standard members for calibration are used, space is saved and it is possible to shorten the time taken for the two-dimensional profile measurement.

Fifth Embodiment

Figure 12:
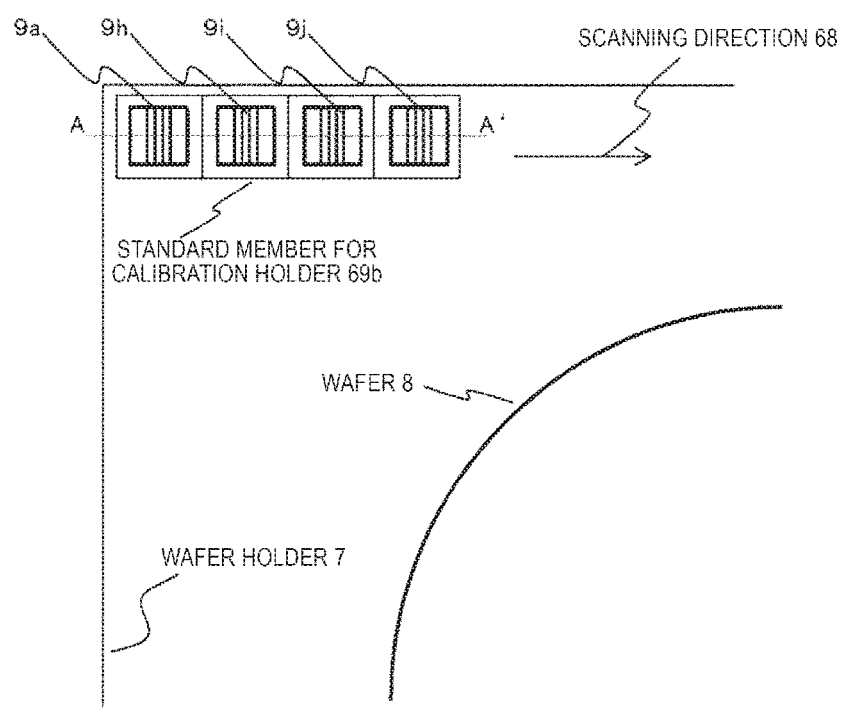
FIG. 12 is a top view of a sample and a calibration member of a fifth embodiment.
Figure 13:
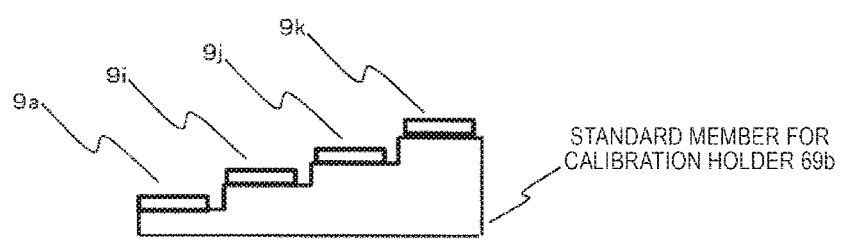
FIG. 13 is a sectional view of a member holder for calibration of the fifth embodiment (A-A').

FIG. 12 is a top view of the wafer holder of the fourth embodiment. In a fifth embodiment of the invention, the plurality of standard members for calibration 9 used in the first to third examples are provided and are disposed at a height different from that of the wafer surface. That is, FIG. 13 is a sectional view of a portion shown by A-A' in FIG. 11.

The standard member for calibration 9a is disposed at the same height as that of the sample wafer 8. Standard member for calibration 9h to 9j are disposed with a level difference of four steps on the standard member for calibration holder 69b having a level difference of 100 nm of each step. A resist pattern having a level difference of 100 nm of each step is manufactured on a silicon substrate by exposure and developing and the standard member for calibration holder 69b is manufactured by dry etching by using the resist pattern as a mask. By using the method described above, it is possible to manufacture the standard member for calibration holder 69b having high accuracy equal to or smaller than 10 nm. The height of the standard member for calibration 9h to 9j after the completion can be measured by using a stylus type step gauge or an atomic force microscope. According to the investigation of the inventors, the measurement accuracy was equal to or smaller than 1 nm.

By measuring the probe diameter by using any of the methods described in the first to third embodiments with respect to the standard member for calibration 9, it is possible to measure the probe diameter in the scanning direction of the primary electron beam, for each height from the wafer surface of each sample. In the fifth embodiment, the four steps are provided with a step of 100 nm, but the invention is not limited thereto. When the step height is further decreased and more standard members for calibration are used, it is possible to obtain height dependency information of the probe diameter of the primary electron beam with higher accuracy. Meanwhile, when the step height is further increased and less standard members for calibration are used, space is saved and it is possible to shorten the time taken for the height dependency measurement of the probe diameter of the primary electron beam.

Sixth Embodiment

In the sixth embodiment of the invention, the plurality of standard members for calibration 9 used in the first to third embodiments are provided, and the level difference of four steps on a standard member for calibration holder 69c having a level difference of 100 nm manufactured in the same manner as the standard member for calibration holder 69b shown in the fifth embodiment is provided. The calibration is performed so as to respectively dispose the standard members for calibration 9 rotated by 0°, 15°, 30°, 45°, 60°, 75°, and 90° with respect to the scanning direction 68 of the primary electron beam shown in the fourth embodiment.

Figure 14:
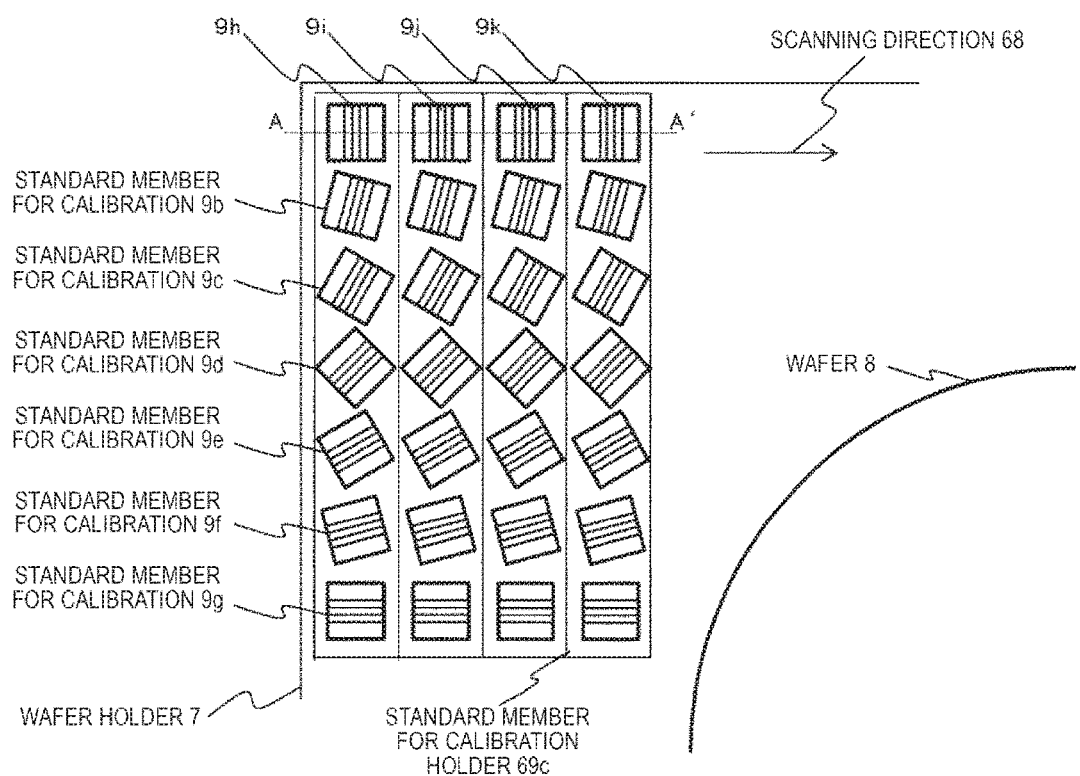
FIG. 14 is a top view of a sample and a calibration member of a sixth embodiment.

FIG. 14 is a top view of the wafer holder of a sixth embodiment. A sectional view of a portion shown by A-A' in FIG. 13 is the same as FIG. 13. By measuring the probe diameter by using any of the methods described in the first to third embodiments with respect to the standard member for calibration 9, it is possible to measure a three-dimensional profile of the primary electron beam. In a sixth embodiment, the four steps are provided with a step of 100 nm and a rotation angle changes by a step of 15°, but the invention is not limited thereto.

Pitch Change

In the first to sixth embodiment, the pitch of the standard members for calibration 9 is fixed at a constant value, but the invention is not limited thereto. For example, the two standard members for calibration 9 having different pitches may be provided on the wafer holder. According to such a configuration, it is possible to increase the accuracy of the measurement by measuring the probe diameter with the two standard members for calibration 9 and using an average value of the values as a probe diameter.

Manufacturing Method of Standard Members for Calibration

Hereinafter, a structure or a composition of the standard members for calibration having traceability described in the first to sixth embodiment, and a manufacturing method thereof will be described.

A standard member for calibration 100 of the invention shown in FIG. 2 includes first to fourth pattern group 101, pattern group 102, pattern group 103, and pattern group 104. Each pattern group is configured with repeating line pattern of the same line width 106, height 107, and the same taper angle 108 with a constant pitch dimension 105, as shown in an enlarged sectional view of a frame part of the first pattern group 101 of FIG. 2. The first to fourth pattern groups are configured with pattern groups in which at least any one value of the pitch dimension 105, the line width 106, the height 107, and the taper angle 108 is different.

In the standard member for calibration 9 described in the first to sixth embodiments, the designed pitch dimension 105 of the first to fourth pattern groups is 20 nm, the designed height thereof is fixed at 20 nm, and the designed line width is 4 nm in the first pattern group, 6 nm in the second pattern group, 8 nm in the third pattern group, and 10 nm in the fourth pattern group.

Figure 15:
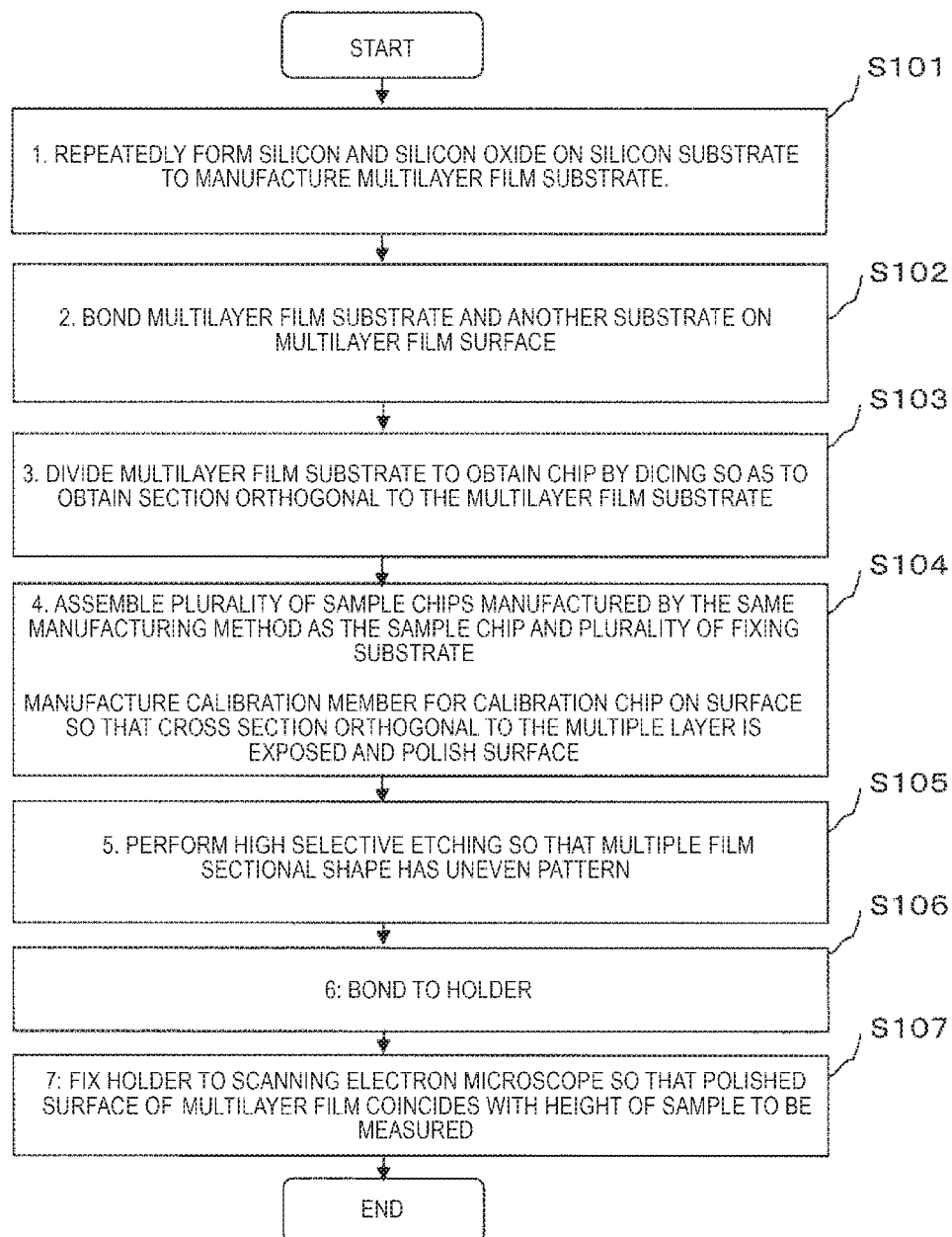
FIG. 15 is a manufacturing process flowchart of the standard member according to the embodiment of the invention.

As shown in S101 of FIG. 15, first, films of silicon and silicon oxide are repeatedly formed on a silicon substrate to manufacture a multilayer film substrate. In the film forming process, a silicon 112 having a designed film thickness of 4 nm and a silicon oxide 113 having a designed film thickness of 16 nm are repeatedly formed 40 times with a designed interlayer pitch dimension of 20 nm on a silicon substrate 109, for example, to manufacture a first multilayer film substrate.

Next, as shown in S102, a multilayer film substrate and another substrate are bonded on a multilayer film surface. For example, a multilayer film surface 111 of a multilayer film substrate 110 and a silicon substrate 114 are bonded at normal temperature in a vacuum state.

Next, as shown in S103, the multilayer film substrate 110 is divided to obtain a chip 115 by dicing so as to obtain a section orthogonal to the multilayer film substrate 110.

Next, a manufacturing method of the second pattern group of the standard member for calibration 9 is shown. In the same manner as the first pattern group, the second pattern group is manufactured in the Step S101 to Step S103 of the manufacturing process of FIG. 15. That is, the silicon 112 having a designed film thickness of 6 nm and the silicon oxide 113 having a designed film thickness of 14 nm are repeatedly formed 40 times with a designed pitch dimension of 20 nm on another silicon substrate 109, to manufacture a second multilayer film substrate.

For the third pattern group, the silicon 112 having a designed film thickness of 8 nm and the silicon oxide 113 having a designed film thickness of 12 nm are repeatedly formed 40 times with a designed pitch dimension of 20 nm, to manufacture a third multilayer film substrate. For the fourth pattern group, the silicon 112 having a designed film thickness of 10 nm and the silicon oxide 113 having a designed film thickness of 10 nm are repeatedly formed 40 times with a designed pitch dimension of 20 nm, to manufacture a fourth multilayer film substrate. As described above, the designed pitch dimension of each pattern group is same, but the line and the space are set to be different, and the first to fourth pattern groups are disposed in parallel at intervals of approximately 1.5 mm, for example.

Figure 16:
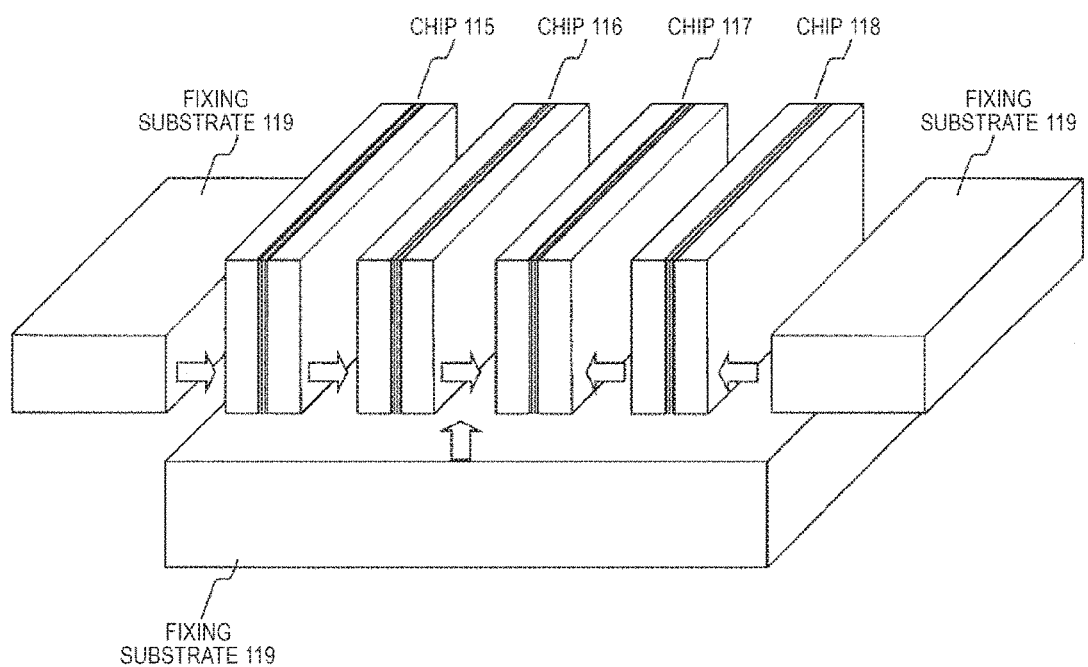
FIG. 16 is a schematic view of an assembling process of the standard members according to the embodiment of the invention.
Figure 17:
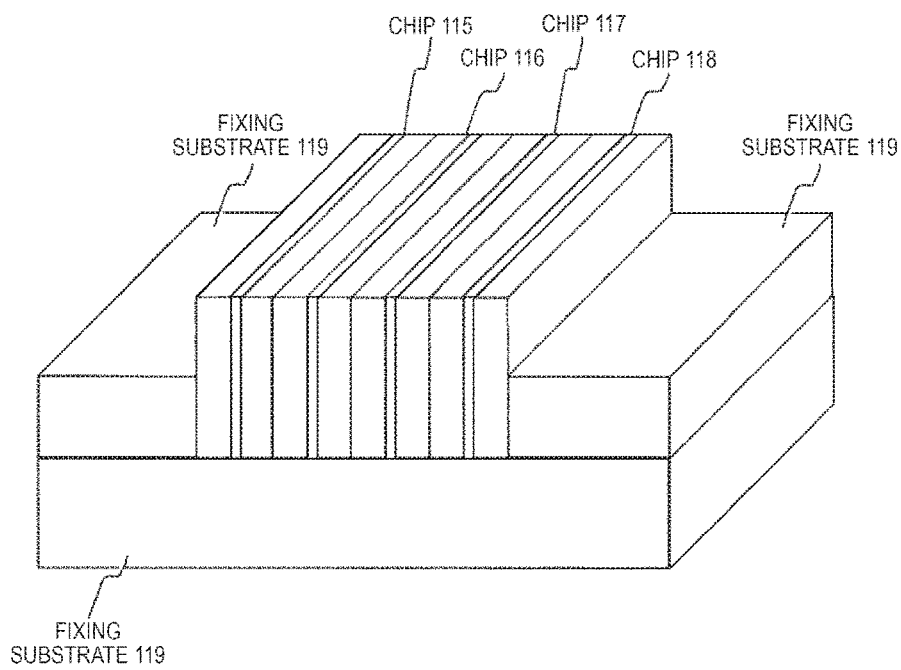
FIG. 17 is a schematic view after the assembly of the standard members according to the embodiment of the invention.

FIGS. 16 and 17 are diagrams of an assembly process of the standard member for calibration. FIG. 16 shows a positional relationship of the arrangement and FIG. 17 shows the assembled state. The manufacturing is performed so that a cross section orthogonal to each multilayer film surface 111 is exposed to an assembly chip surface of the divided chip 115, chip 116, chip 117, chip 118 and the plurality of fixing substrates 119.

FIG. 18 is a schematic view after the polishing process of the standard member for calibration. The surface of the manufactured chip is polished until the same height as that of the fixing substrate 119 is obtained (S104).

Next, in S105, the polished calibration member is put into a solution having a composition of hydrofluoric acid:water=1:200 and wet etching is performed. As shown in FIG. 2, the silicon oxide is selectively etched by the wet etching and it is possible to obtain a line pattern 120 of the silicon. The selectively etched silicon oxide becomes a space 121. After the wet etching, the wet-etched member is washed with flowing water. After washing with flowing water, the member is dried. The height 107 obtained by the wet etching can be controlled by changing the time of the wet etching.

Figure 19:
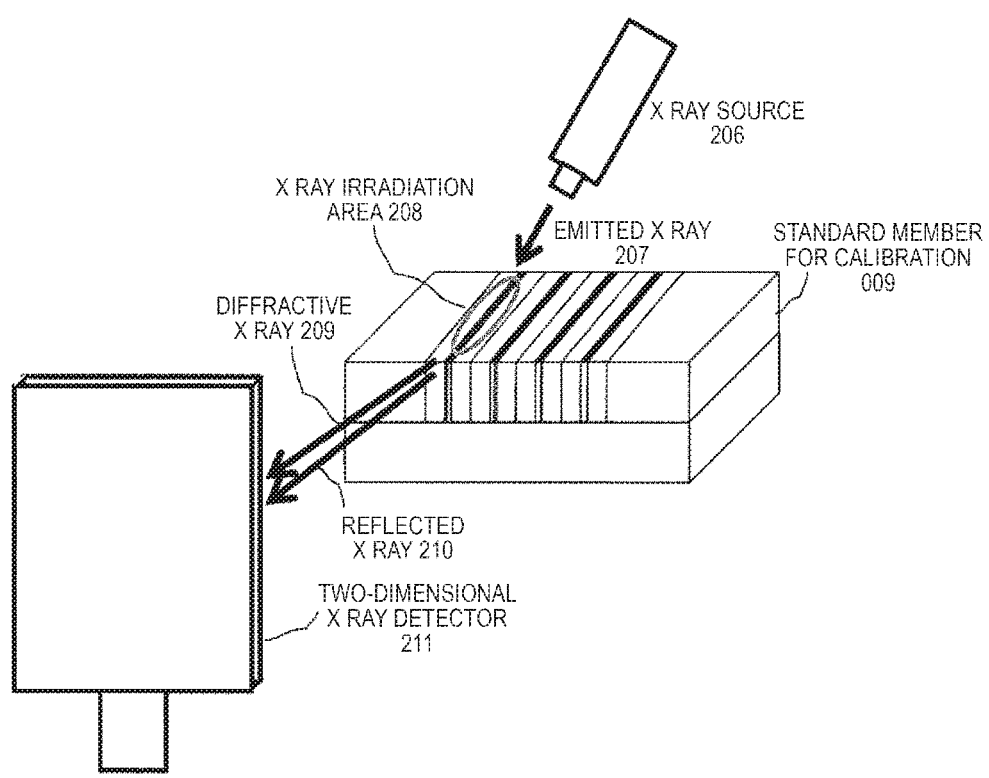
FIG. 19 is a diagram showing X-ray calibration of the standard members according to the embodiment of the invention.

Next, as shown in FIG. 19, the dried standard member for calibration 9 is bonded to the standard member for calibration holder 69a (S106), and the holder is fixed to a scanning electron microscope so that the polished surface of the multilayer film coincides with the height of the sample to be measured (S107).

Different Sectional Shape

As a different configuration, ion milling or dry etching is performed to the chips obtained in Step S105 of FIG. 15, and accordingly, it is possible to change the taper angle 108 shown in FIG. 2. Therefore, it is possible to change the sectional shape of the line. According to the investigation of the inventors, when milling is performed by argon ion for the chip with the taper angle of 90.0 degrees obtained in Step S105 of FIG. 15 in the embodiment described above, it is found that it is possible to obtain a standard member for calibration having the taper angle 108 of 88.2 degrees, without changing the pitch dimension 105 and the line width 106.

Different Line Material

The silicon oxide is selectively etched by using a wet etching solution having a composition of hydrofluoric acid: water=1:200 in Step S105, but silicon selective etching can be performed by setting the wet etching solution as an alkali aqueous solution such as trimethyl ammonium hydride (TMAH), and accordingly, it is possible to manufacture a standard member for calibration in which the space part is a silicon 123. Therefore, it is possible to manufacture a line pattern group formed of an insulating material and to manufacture a standard member for calibration usable for verifying effects of charges.

In the above description, the material of the standard member for calibration is set as a multilayer film of the silicon 112 and the silicon oxide 113, but the standard member for calibration of the invention is not limited to the material configuration described above. For example, a material configuration of molybdenum and silicon or tungsten and silicon may be used. It is possible to manufacture a standard member for calibration having a configuration of a molybdenum line and a silicon space, a tungsten line and a silicon space, or a tantalum line and a silicon space, by using an etching solution having each appropriate selection ratio. When forming the line part, the wet etching is performed in Step S105, but dry etching may be used. Controllability of line height or the like is increased by using dry etching.

The standard member for calibration of the invention may be manufactured by using a nonoimprint technology using the standard member for calibration 9 as a die. By using such a manufacturing method, it is possible to provide the standard member for calibration at low cost.

Calibration Method of Standard Member for Calibration

Hereinafter, a calibration example of the standard member for calibration according to the invention will be described.

Regarding the standard member for calibration of the invention, as shown in FIG. 2, the first pattern group 101 in which 40 lines having a designed width of 4 nm are repeatedly formed at the designed pitch dimension 20 nm is in the same standard member for calibration 9. The second pattern group 102 in which 40 lines having a designed width of 6 nm are repeatedly formed at the designed pitch dimension 20 nm, the third pattern group 103 in which 40 lines having a designed width of 8 nm are repeatedly formed at the designed pitch dimension 20 nm, and the fourth pattern group 104 in which 40 lines having a designed width of 10 nm are repeatedly formed at the designed pitch dimension 20 nm are also provided. The pattern groups are arranged in parallel to each other at intervals of approximately 1.5 mm.

Next, a calibration method of the line width and the pitch dimension of each pattern group is shown in FIG. 19. A sectional shape of a fine pattern having periodicity at a constant pitch dimension, a line width, and a pitch dimension can be acquired by using grazing incidence small-angle x-ray scattering (GI-SAXS). Since the measurement value obtained by the measurement has traceability so that the reference of the absolute dimension can be traced to an X-ray wavelength, the obtained pitch dimension, line width, and height are acquired with accuracy equal to or smaller than 0.1 nm as the absolute dimensions. In the same manner, the taper angle is acquired with accuracy equal to or smaller than 0.1 degrees as the absolute dimensions.

First, an X ray 207 (for example, wavelength of 0.15405929 nm is used) generated by an X ray source 206 is emitted to the first pattern group 101 of the standard member 9 shown in FIG. 19 at approximately 1 degree with respect to a horizontal surface as shown in FIG. 19. At that time, the X ray is emitted to substantially the entire surface of the first pattern group 101, approximately 10 mm in the irradiation direction and 100 μm in the orthogonal direction with respect to the irradiation, as shown in the X-ray irradiation area 208 of FIG. 19, under the conditions in which an irradiation area 208 of the X-ray beam on the pattern group is kept to be smallest.

The X ray scattered in the pattern group is measured by a two-dimensional detector 211 as a diffraction pattern formed of a reflective X ray 209 and a diffractive X ray 210, as shown in FIG. 19. From the diffraction pattern obtained as described above, an average pitch dimension 212, an average line width 213, an average height 214, and an average taper angle 215 of the irradiation area of the X ray beam are obtained as shape parameters of the sectional structure of the pattern group.

That is, these values are analyzed only from the geometrical X ray diffraction, and absolute value thereof is regulated by a wavelength and a diffraction angle of the X ray used. The wavelength (0.15405929 nm) of the X ray used in the measurement is applied as an absolute value and the angle can be measured with accuracy equal to or smaller than 0.01 degrees, and accordingly, the average pitch dimension 212, the average line width 213, and the average height 214 of the standard member for calibration in the irradiation area of the X ray beam are acquired as absolute dimensions with accuracy equal to or smaller than 0.1 nm.

In the same manner as described above, the taper angle is also acquired with accuracy equal to or smaller than 0.1 degrees. The average line width and the average pitch dimension of the first pattern group 101 in the irradiation area 208 of the X ray beam were respectively 4.1 nm and 20.2 nm. The height was 16 nm and the taper angle was 90.0 degrees.

Regarding the second pattern group 102 and other groups, the irradiation area 208 of the X ray beam was moved to the second pattern group 102 and the measurement was performed, and the average line width and the average pitch dimension of the second pattern group 102 were respectively 6.2 nm and 20.3 nm. The height was 16.5 nm and the taper angle was 90.0 degrees.

As described above, since the pattern groups are arranged in parallel to each other at intervals of 1.5 mm, the irradiation position of the X ray beam of the first pattern group 101 and the second pattern group 102 is moved to each pattern group, and accordingly, it is possible to separate the irradiation area of the X ray beam with each pattern group.

Therefore, the X ray beam irradiation is performed for each pattern group and the diffractive pattern analysis is performed in the same manner as described above, thus, the average line width, the average pitch dimension, and the height or the taper angle of each pattern group are independently obtained.

Also, regarding the third pattern group 103 and the fourth pattern group 104, by moving the irradiation position of the X ray beam to each pattern group as described above, the average line width, the average pitch dimension, and the height or the taper angle of each pattern group are independently obtained.

As described above, the average line width, the average pitch dimension, and the height or the taper angle of each pattern group of the standard member for calibration of the invention may not coincide with the designed dimensions due to a variation at the time of manufacturing. The value measured by using X ray may be used as a correct value.

That is, in a case of providing the configuration to a user by incorporating the configuration in the CD-SEM or the inspection SEM, the average line width, the average pitch dimension, and the height or the taper angle of the standard member for calibration to be mounted are measured by using the small angle X-ray scattering technique, and the configuration is provided to a user in a state where those values are stored in the CD-SEM or the inspection SEM or are clearly shown in a specification.

In a case of providing the standard member for calibration as a single body to a user, the average line width, the average pitch dimension, and the height or the taper angle of the standard member for calibration are measured by using the small angle X-ray scattering technique, and the configuration is provided to a user in a state where those values are shown in a specification or are recorded in electronic data equivalent thereto.

In the first to sixth embodiments, the example of performing adjustment of the device by acquiring the probe profile by using the results of the average line width obtained by using incidence small-angle x-ray scattering as the actual dimensions was described. As described above, since the measurement value used as the actual dimension has traceability so that the reference of the absolute dimension can be traced to an X-ray wavelength, it is possible to provide probe profiles having traceability in the method according to the invention or the CD-SEM and the inspection SEM according to the invention.

Providing Way to User: Degree of Freedom of Sample Shape

As described above, in the standard member for calibration of the invention, it is possible to adjust the height 214 of FIG. 2 by controlling the etching time at the time of manufacturing or change the taper angle 215 by performing the ion milling process before and after the etching. In addition, since the height or the taper angle of the manufactured pattern group are also measured in the diffractive pattern measurement, it is possible to manufacture a standard member for calibration having a shape closer to a sectional shape of a semiconductor device to be actually measured in the CD-SEM and to maintain and control the CD-SEM by performing the calibration by incidence small-angle x-ray scattering. Therefore, it is possible to perform the probe diameter measurement with the shape closer to the actual measurement target and to expect high accuracy of the device control.

As measurement by using a transmission electron microscope (TEM), it is possible to ensure traceability of a calibration member to be provided, without necessity of a destructive inspection of the calibration member at the time of the measurement.

Timing of Optical System Adjustment

Figure 3:
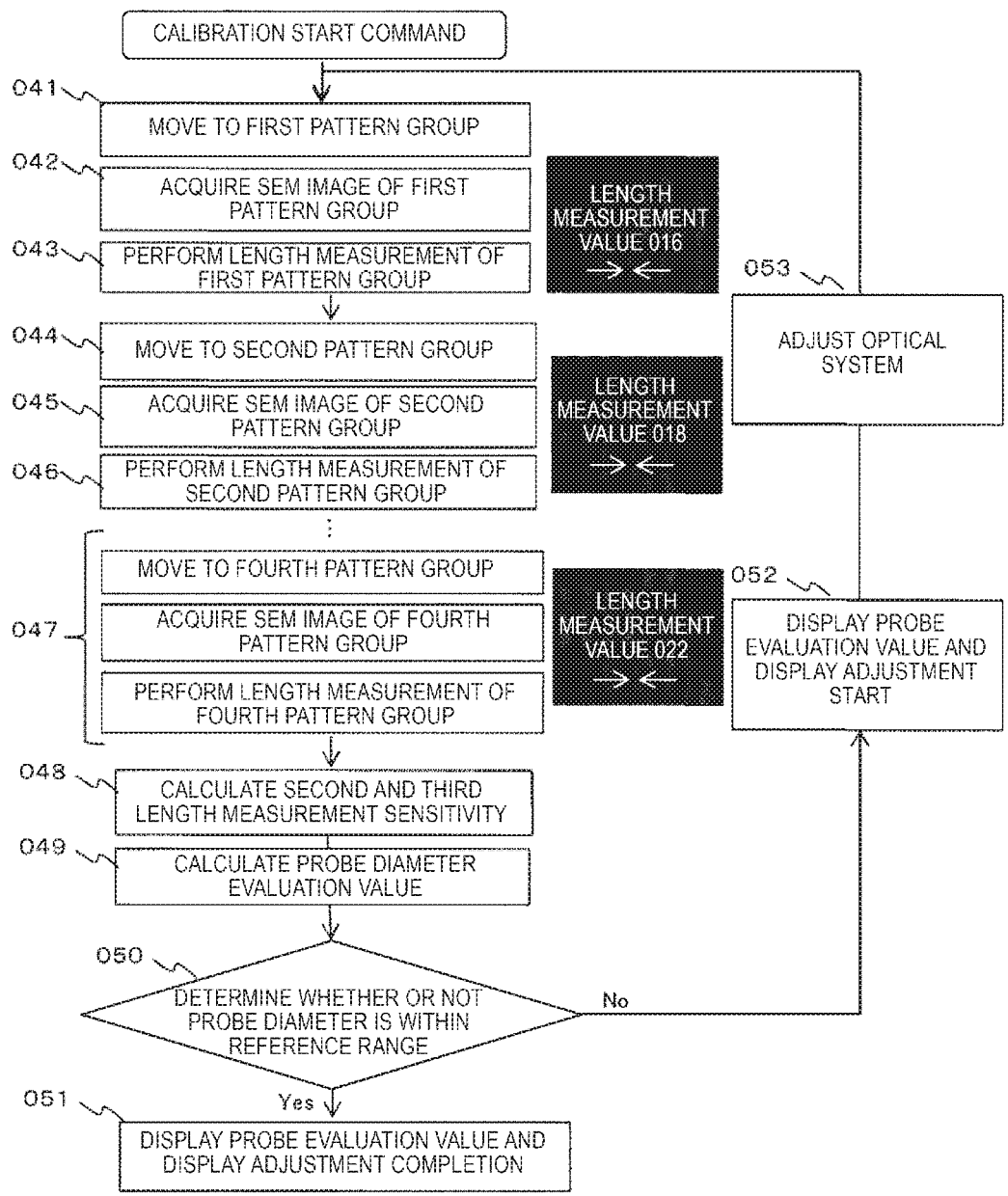
FIG. 3 is a diagram showing a flowchart of a first embodiment.

The starting timing of the process to perform the device adjustment based on the results obtained by measuring the probe diameter shown in FIG. 3 or FIG. 9 as flowcharts may be regularly set with a determined cycle. In this case, it is possible to automatically adjust a change over time in the process of a long-term operation. The starting timing of the process may be determined by a user or may be incorporated to a recipe so as to start the process before starting or after completing of desired length measurement recipe and inspection recipe. Thus, it is possible to operate a device while controlling the probe state.

What is claimed is:

1. A measurement device comprising: an irradiation optical system which emits a primary charged quantum beam to a sample for scanning; a detector which detects secondary charged particles generated from the sample; and a signal processing unit which processes an output signal from the secondary charged particle detector which has detected the secondary charged particles, wherein the signal processing unit includes a measurement unit which measures a line width of a first pattern group having a first line width calibrated with a well-known dimension, and a line width of a second pattern group having a second line width calibrated with a well-known dimension, and an operation unit which defines a relationship between the first and second line widths of the first and second pattern groups and length measurement values of the first and second pattern groups as a function.

2. The measurement device according to claim 1, further comprising: a measurement unit which measures profiles of the secondary charged particle beam to be a probe based on the first and second line widths of the first and second pattern groups and length measurement values of the first and second pattern groups.

3. The measurement device according to claim 2, further comprising: a determination unit which compares the profiles measured by the measurement unit with a regulated value stored in advance and determines whether or not the profiles are in an acceptable range.

4. The measurement device according to claim 3, wherein, in a case where the profiles are not in the acceptable range, the determination unit transmits a signal for displaying a result of the determination to a display unit or transmits a signal for adjusting conditions of the measurement to the irradiation optical system or the detector.

5. The measurement device according to claim 4, wherein the defined function is a linear function, and the determination unit compares a value of a tilt and a value of a piece obtained with regulated values, and in a case where the values are not in the acceptable range, the determination unit estimates adjustment parameters of the irradiation optical system or the detector and transmits a signal for displaying a result of the estimation to the display unit or transmits a signal for adjusting the adjustment parameters to a adjustment target.

6. The measurement device according to claim 3, wherein the determination unit determines performance or non-performance of re-adjustment of the optical system for each regulated cycle, based on a value of a probe diameter of the primary charged particle beam.

7. The measurement device according to claim 1, wherein the length measurement unit measures line widths of the first and second pattern groups extending in a first direction and line widths of the first and second pattern groups extending in a second direction in the surface in a orthogonal direction to an optical axis of the primary charged particle beam.

8. The measurement device according to claim 1, wherein the length measurement unit measures line widths of the first and second pattern groups disposed at a first height and measures line widths of the first and second pattern groups disposed at a second height in an optical axis direction of the primary charged particle beam.

9. A calibration method of a measurement device including an irradiation optical system which emits a primary charged quantum beam to a sample for scanning, a detector which detects secondary charged particles generated from the sample, and a signal processing unit which processes an output signal from the secondary charged particle detector which has detected the secondary charged particles, the method comprising:

measuring a line width of a first pattern group having a first line width calibrated with a well-known dimension and a line width of a second pattern group having a second line width calibrated with a well-known dimension; and defining a relationship between the first and second line widths of the first and second pattern groups and length measurement values of the first and second pattern groups as a function.

10. The calibration method of a measurement device according to claim 9, further comprising: measuring profiles of the primary charged particle beam to be a probe based on the first and second line widths of the first and second pattern groups and length measurement values of the first and second pattern groups.

11. The calibration method of a measurement device according to claim 10, further comprising: calculating a value of tilt and a value of a piece, by setting the defined function as a linear function; comparing the value of tilt and the value of a piece with a regulated value stored in advance and estimating adjustment parameters of the irradiation optical system or the detector; and displaying the result of the estimation or transmitting a signal for adjusting the adjustment parameters to an adjustment target.

12. The calibration method of a measurement device according to claim 9, wherein the first and second line widths are calibrated by using an X ray.

13. A calibration member for a charged particle beam device for performing calibration by using an Xray, comprising:

a first pattern group formed to have a well-known first line width; and a second pattern group formed to have a well-known second line width, wherein the first pattern group and the second pattern group are provided to be separated by a distance so that the X ray used for the calibration is not interfered with.

14. The calibration member according to claim 13, wherein the first and second pattern groups have a well-known taper angle.

15. The calibration member according to claim 13, which is calibrated by incidence small-angle x-ray scattering.

* * * * *